(12) United States Patent
Martens

(10) Patent No.: US 10,788,529 B1
(45) Date of Patent: Sep. 29, 2020

(54) METHOD FOR NETWORK EXTRACTION BASED ON PHASE LOCALIZATION

(71) Applicant: ANRITSU COMPANY, Morgan Hill, CA (US)

(72) Inventor: Jon S. Martens, San Jose, CA (US)

(73) Assignee: ANRITSU COMPANY, Morgan Hill, CA (US)

( * ) Notice: Subject to any disclaimer, the term of this patent is extended or adjusted under 35 U.S.C. 154(b) by 207 days.

(21) Appl. No.: 15/967,387

(22) Filed: Apr. 30, 2018

Related U.S. Application Data

(60) Provisional application No. 62/492,091, filed on Apr. 28, 2017.

(51) Int. Cl.
*G01R 31/28* (2006.01)
*G01R 31/319* (2006.01)

(52) U.S. Cl.
CPC ... *G01R 31/2837* (2013.01); *G01R 31/31905* (2013.01); *G01R 31/31915* (2013.01)

(58) Field of Classification Search
CPC .......... G01R 31/2837; G01R 31/31915; G01R 31/31905
See application file for complete search history.

(56) References Cited

U.S. PATENT DOCUMENTS

| | | | |
|---|---|---|---|
| 5,801,525 A | 9/1998 | Oldfield | |
| 5,812,039 A | 9/1998 | Oldfield | |
| 5,909,192 A | 6/1999 | Finch | |
| 5,977,779 A | 11/1999 | Bradley | |
| 6,049,212 A | 4/2000 | Oldfield | |
| 6,291,984 B1 | 9/2001 | Wong | |
| 6,316,945 B1 | 11/2001 | Kapetanic | |
| 6,331,769 B1 | 12/2001 | Wong | |
| 6,496,353 B1 | 12/2002 | Chio | |
| 6,504,449 B2 | 1/2003 | Constantine | |
| 6,509,821 B2 | 1/2003 | Oldfield | |
| 6,525,631 B1 | 2/2003 | Oldfield | |
| 6,529,844 B1 | 3/2003 | Kapetanic | |
| 6,548,999 B2 | 4/2003 | Wong | |
| 6,650,123 B2 | 11/2003 | Martens | |
| 6,665,628 B2 | 12/2003 | Martens | |
| 6,670,796 B2 | 12/2003 | Mori | |
| 6,680,679 B2 | 1/2004 | Stickle | |

(Continued)

OTHER PUBLICATIONS

Akmal, M. et al., "An Enhanced Modulated Waveform Measurement System for the Robust Characterization of Microwave Devices under Modulated Excitation", Proceedings of the 6th European Microwave Integrated Circuits Conference, © 2011, Oct. 2011, Manchester, UK, pp. 180-183.

(Continued)

*Primary Examiner* — Akm Zakaria
(74) *Attorney, Agent, or Firm* — Tucker Ellis LLP

(57) ABSTRACT

A method of network extraction based on phase localization using a test setup including a standard includes measuring frequency data using a measuring instrument connected with the test setup by performing a frequency sweep across an identified bandwidth, correlating filter functions as required against the measured frequency domain data to localize phase across the test setup, removing excess phase rotation and solving for inner plane match of the test setup based on known composite measurement and previously identified components of the test setup.

20 Claims, 3 Drawing Sheets

(56) References Cited

U.S. PATENT DOCUMENTS

| | | |
|---|---|---|
| 6,700,366 B2 | 3/2004 | Truesdale |
| 6,700,531 B2 | 3/2004 | Abou-Jaoude |
| 6,714,898 B1 | 3/2004 | Kapetanic |
| 6,766,262 B2 | 7/2004 | Martens |
| 6,832,170 B2 | 12/2004 | Martens |
| 6,839,030 B2 | 1/2005 | Noujeim |
| 6,882,160 B2 | 4/2005 | Martens |
| 6,888,342 B2 | 5/2005 | Bradley |
| 6,894,581 B2 | 5/2005 | Noujeim |
| 6,917,892 B2 | 7/2005 | Bradley |
| 6,928,373 B2 | 8/2005 | Martens |
| 6,943,563 B2 | 9/2005 | Martens |
| 7,002,517 B2 | 2/2006 | Noujeim |
| 7,011,529 B2 | 3/2006 | Oldfield |
| 7,016,024 B2 | 3/2006 | Bridge |
| 7,019,510 B1 | 3/2006 | Bradley |
| 7,054,776 B2 | 5/2006 | Bradley |
| 7,068,046 B2 | 6/2006 | Martens |
| 7,088,111 B2 | 8/2006 | Noujeim |
| 7,108,527 B2 | 9/2006 | Oldfield |
| 7,126,347 B1 | 10/2006 | Bradley |
| 7,284,141 B2 | 10/2007 | Stickle |
| 7,304,469 B1 | 12/2007 | Bradley |
| 7,307,493 B2 | 12/2007 | Feldman |
| 7,509,107 B2 | 3/2009 | Bradley |
| 7,511,496 B2 | 3/2009 | Schiano |
| 7,511,577 B2 | 3/2009 | Bradley |
| 7,521,939 B2 | 4/2009 | Bradley |
| 7,545,151 B2 | 6/2009 | Martens |
| 7,683,602 B2 | 3/2010 | Bradley |
| 7,683,633 B2 | 3/2010 | Noujeim |
| 7,705,582 B2 | 4/2010 | Noujeim |
| 7,746,052 B2 | 6/2010 | Noujeim |
| 7,764,141 B2 | 7/2010 | Noujeim |
| 7,872,467 B2 | 1/2011 | Bradley |
| 7,924,024 B2 | 4/2011 | Martens |
| 7,957,462 B2 | 6/2011 | Aboujaoude |
| 7,983,668 B2 | 7/2011 | Tiernan |
| 8,027,390 B2 | 9/2011 | Noujeim |
| 8,058,880 B2 | 11/2011 | Bradley |
| 8,145,166 B2 | 3/2012 | Barber |
| 8,156,167 B2 | 4/2012 | Bradley |
| 8,159,208 B2 | 4/2012 | Brown |
| 8,169,993 B2 | 5/2012 | Huang |
| 8,185,078 B2 | 5/2012 | Martens |
| 8,278,944 B1 | 10/2012 | Noujeim |
| 8,294,469 B2 | 10/2012 | Bradley |
| 8,305,115 B2 | 11/2012 | Bradley |
| 8,306,134 B2 | 11/2012 | Martens |
| 8,410,786 B1 | 4/2013 | Bradley |
| 8,417,189 B2 | 4/2013 | Noujeim |
| 8,457,187 B1 | 6/2013 | Aboujaoude |
| 8,493,111 B1 | 7/2013 | Bradley |
| 8,498,582 B1 | 7/2013 | Bradley |
| 8,593,158 B1 | 11/2013 | Bradley |
| 8,629,671 B1 | 1/2014 | Bradley |
| 8,630,591 B1 | 1/2014 | Martens |
| 8,666,322 B1 | 3/2014 | Bradley |
| 8,718,586 B2 | 5/2014 | Martens |
| 8,760,148 B1 | 6/2014 | Bradley |
| 8,816,672 B1 | 8/2014 | Bradley |
| 8,816,673 B1 | 8/2014 | Barber |
| 8,884,664 B1 | 11/2014 | Bradley |
| 8,903,149 B1 | 12/2014 | Noujeim |
| 8,903,324 B1 | 12/2014 | Bradley |
| 8,942,109 B2 | 1/2015 | Dorenbosch |
| 9,103,856 B2 | 8/2015 | Brown |
| 9,103,873 B1 | 8/2015 | Martens |
| 9,176,174 B1 | 11/2015 | Bradley |
| 9,176,180 B1 | 11/2015 | Bradley |
| 9,210,598 B1 | 12/2015 | Bradley |
| 9,239,371 B1 | 1/2016 | Bradley |
| 9,287,604 B1 | 3/2016 | Noujeim |
| 9,331,633 B1 | 5/2016 | Robertson |
| 9,366,707 B1 | 6/2016 | Bradley |
| 9,455,792 B1 | 9/2016 | Truesdale |
| 9,560,537 B1 | 1/2017 | Lundquist |
| 9,571,142 B2 | 2/2017 | Huang |
| 9,588,212 B1 | 3/2017 | Bradley |
| 9,594,370 B1 | 3/2017 | Bradley |
| 9,606,212 B1 | 3/2017 | Martens |
| 9,696,403 B1 | 7/2017 | Elder-Groebe |
| 9,733,289 B1 | 8/2017 | Bradley |
| 9,753,071 B1 | 9/2017 | Martens |
| 9,768,892 B1 | 9/2017 | Bradley |
| 9,860,054 B1 | 1/2018 | Bradley |
| 9,964,585 B1 | 5/2018 | Bradley |
| 9,967,085 B1 | 5/2018 | Bradley |
| 9,977,068 B1 | 5/2018 | Bradley |
| 10,003,453 B1 | 6/2018 | Bradley |
| 10,006,952 B1 | 6/2018 | Bradley |
| 10,064,317 B1 | 8/2018 | Bradley |
| 10,116,432 B1 | 10/2018 | Bradley |
| 2003/0132758 A1* | 7/2003 | Martens ............... G01R 27/28 324/601 |
| 2006/0250135 A1 | 11/2006 | Buchwald |
| 2011/0037667 A1 | 2/2011 | Varjonen |
| 2014/0071436 A1* | 3/2014 | Cyr .................. G01N 21/21 356/73.1 |
| 2016/0050032 A1 | 2/2016 | Emerson |
| 2017/0185733 A1* | 6/2017 | Nogueira ............ G06N 3/126 |

OTHER PUBLICATIONS

Cunha, Telmo R. et al., "Characterizing Power Amplifier Static AM/PM with Spectrum Analyzer Measurements", IEEE © 2014, 4 pages.

Fager, Christian et al., "Prediction of Smart Antenna Transmitter Characteristics Using a New Behavioral Modeling Approach" IEEE ® 2014, 4 pages.

Fager, Christian et al., "Analysis of Nonlinear Distortion in Phased Array Transmitters" 2017 International Workshop on Integrated Nonlinear Microwave and Millmetre-Wave Circuits (INMMiC), Apr. 20-21, 2017, Graz, Austria, 4 pages.

Martens, J. et al., "Towards Faster, Swept, Time-Coherent Transient Network Analyzer Measurements" 86th ARFTG Conf. Dig., Dec. 2015, 4 pages.

Martens, J., "Match correction and linearity effects on wide-bandwidth modulated AM-AM and AM-PM measurements" 2016 EuMW Conf. Dig., Oct. 2016, 4 pages.

Nopchinda, Dhecha et al., "Emulation of Array Coupling Influence on RF Power Amplifiers in a Measurement Setup", IEEE © 2016, 4 pages.

Pedro, Jose Carlos et al., "On the Use of Multitone Techniques for Assessing RF Components' Intermodulation Distortion", IEEE Transactions on Microwave Theory and Techniques, vol. 47, No. 12, Dec. 1999, pp. 2393-2402.

Ribeiro, Diogo C. et al., "D-Parameters: A Novel Framework for Characterization and Behavorial Modeling of Mixed-Signal Systems", IEEE Transactions on Microwave Theory and Techniques, vol. 63, No. 10, Oct. 2015, pp. 3277-3287.

Roblin, Patrick, "Nonlinear RF Circuits and Nonlinear Vector Network Analyzers; Interactive Measurement and Design Techniques", The Cambridge RF and Microwave Engineering Series, Cambridge University Press © 2011, entire book.

Rusek, Fredrik et al., "Scaling Up MIMO; Opportunities and challenges with very large arrays", IEEE Signal Processing Magazine, Jan. 2013, pp. 40-60.

Senic, Damir et al., "Estimating and Reducing Uncertainty in Reverberation-Chamber Characterization at Millimeter-Wave Frequencies", IEEE Transactions on Antennas and Propagation, vol. 64, No. 7, Jul. 2016, pp. 3130-3140.

Senic, Damir et al., "Radiated Power Based on Wave Parameters at Millimeter-wave Frequencies for Integrated Wireless Devices", IEEE © 2016, 4 pages.

* cited by examiner

METHOD FOR NETWORK EXTRACTION BASED ON PHASE LOCALIZATION

CLAIM OF PRIORITY

This application claims the benefit of priority to U.S. Provisional Application titled "METHOD FOR NETWORK EXTRACTION BASED ON PHASE LOCALIZATION", Application No. 62/492,091, filed Apr. 28, 2017, which application is herein incorporated by reference.

TECHNICAL FIELD

The present invention relates generally to methods of measuring an electrical response of a device under test (DUT) and instruments that measure an electrical response of a DUT to test signals.

BACKGROUND

Different network extraction methods exist that vary in performance depending on characteristics of a device under test (DUT), a fixture connecting a measuring instrument to the DUT, and standards that are available at the DUT plane. Current approaches fall under a class of methods that can be termed 'partial information' in that only an incomplete set of standards is available and generally transmission parameters of the fixture are given accuracy priority over reflection parameters and additional assumptions are made about the fixture.

Within that class are methods that make assumptions about the spatial location of mismatch within the fixture or attempt to identify the locations of those mismatches. In the 'assumption' area are those that assume no mismatch at the DUT plane or those that assume only one or two point defect centers. These have more limited application against the general class of fixtures.

BRIEF DESCRIPTION OF THE DRAWINGS

Further details of the present invention are explained with the help of the attached drawings in which.

DETAILED DESCRIPTION

Figure 1:
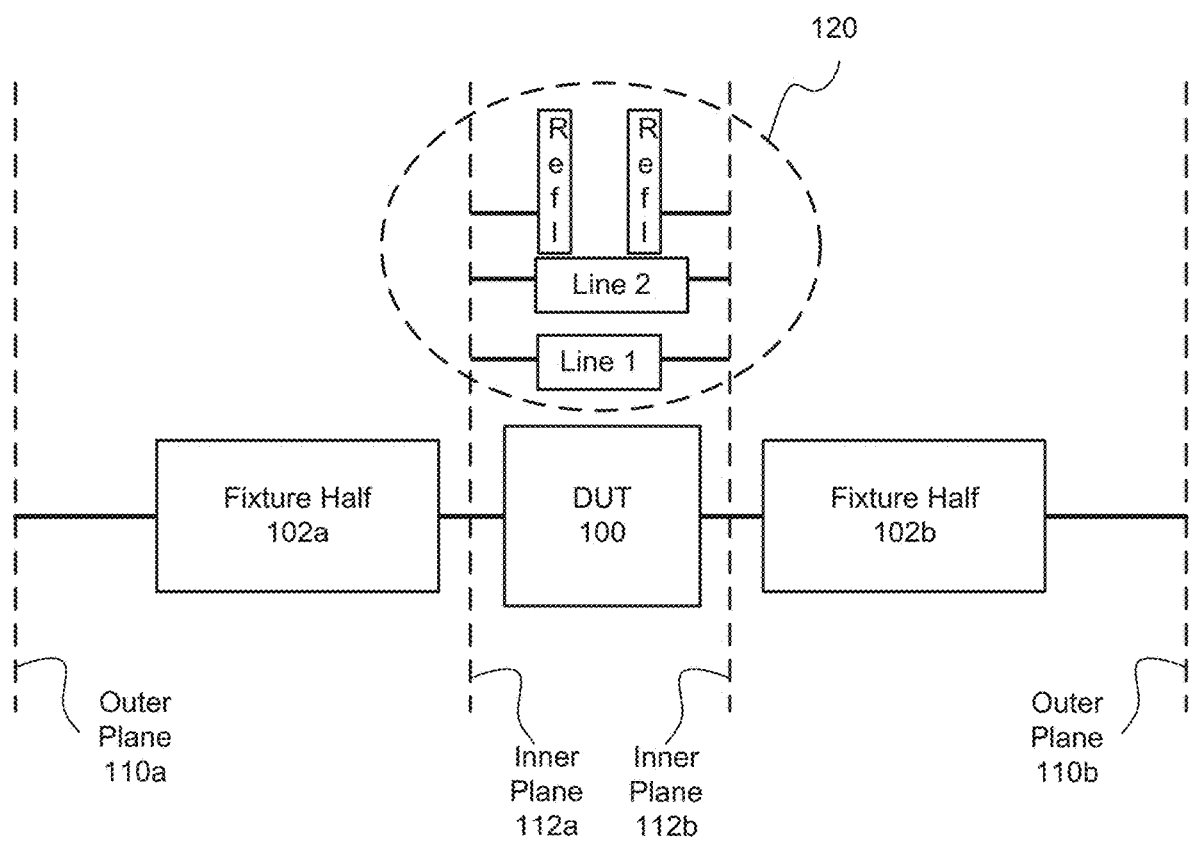
FIG. 1 illustrates a basic setup for performing network extraction, in accordance with an embodiment.

The following description is of the best modes presently contemplated for practicing various embodiments of the present invention. The description is not to be taken in a limiting sense but is made merely for the purpose of describing the general principles of the invention. The scope of the invention should be ascertained with reference to the claims. In the description of the invention that follows, like numerals or reference designators will be used to refer to like parts or elements throughout.

In the following description, numerous specific details are set forth to provide a thorough description of the invention. However, it will be apparent to those skilled in the art that the invention may be practiced without these specific details. In other instances, well-known features have not been described in detail so as not to obscure the invention.

Measuring the electrical characteristics of a device under test (DUT) can be challenging. Often the final device that needs to be measured is not well connectorized. For example, an integrated circuit package or die may be connected to a measuring instrument via a probe that itself may not be well characterized. Between the normal coaxial or waveguide or other standard planes of a measuring instrument such as a vector network analyzer (VNA), there is a fixture, such as a probe, that contributes to the electrical performance of the system under test.

Electrical network extraction attempts to characterize a fixture so that the fixture can be de-embedded from the measurement results, effectively moving the net reference planes to the DUT, which is the portion of the system of interest. There are many different techniques for performing network extraction. Many make assumptions about the electrical characteristics of a fixture or ignore the contributions of the fixture all together. For example, some techniques make assumptions about the fixture, such as associating all mismatch with the outer plane and assuming no mismatch at the inner plane. Other techniques assume mismatch is completely symmetric.

Still other techniques attempt to characterize the fixture using multiple standards to solve for the fixtures deterministically. The disadvantage of such techniques is that they require many connections, and repeatability of the connections at the inner plane may not be very good, resulting in reduced accuracy. The net accuracy of such techniques can in fact be relatively poor, depending on the interface at the inner plane.

Still further techniques rely on time domain processing, transforming measurement data from the frequency domain to the time domain and determining which portion of the data are generated at the fixture based on the timing of the electrical response and the known geometry of the test setup. Based on the geometry of the test setup, the end of a fixture half is roughly known. Observing frequency data in the time domain, it can be roughly known where a reflected standard, for example, is located. Reflections measured earlier in time than the fixture half are therefore not related with the inner plane interface, but is related just to mismatch of the fixture half. Likewise, using a through standard to measure an S21 scattering (S-) parameter across a pair of fixture halves, the time delay is known so that a later time response in the S21 measurement is due to some multiple reflections within the fixture halves. These measurement relating to different portions of the test setup can be extracted from the data to characterize a DUT. However, time domain functions are computationally expensive.

Techniques that explicitly employ time-domain-gating require taking measured data from the frequency domain to the time domain, placing time bounds on the area of interest, and returning to the frequency domain. Although effective, such techniques can be computationally inefficient, which can impact performance for high numbers of frequency points, and often lead to effective point-defect localization which limits the class of fixtures that can be successfully analyzed.

In accordance with an embodiment, systems and methods in accordance with the present invention correlate the phase of measured parameters against a pattern (i.e., a given phase slope) to identify portions of the fixture model that match that electrical length. Information is localized in the frequency domain by correlating the data against phase kernels based on the known propagation characteristics of the fixture. As a signal propagates through a medium, it tends to vary at $e^{-j\omega\tau}$, where $\omega$ represents angular frequency. Knowing the frequency data and the time scale of the size of a fixture half, an amount of phase change can be calculated and correlated. By correlating phase and observing phase shift data can be analyzed in the frequency domain without taking the data to the time domain, thereby avoiding the performance penalty of doing so.

Localizing information based on phase provides computational advantages over time domain gating, and additionally improves upon a scenario that is not limited to a point defect mismatch in the fixture, but rather includes, for example, impedance mismatches. For example, where a length of transmission line in a 50 ohm system has a section that is 70 ohms covering half the fixture. Time domain processing may not be usable, or present problems analyzing such a test set up.

Systems and methods in accordance with embodiments can be applied to improve the functionality of vector network analyzer (VNA) or VNA-like measurements by introducing a technique of network extraction to assist in the de-embedding of fixtures and similar structures from measured data. Specifically, a method in accordance in an embodiment is useful when a complete set of standards at the DUT plane is not available (or not well-known), the fixture is not electrically short relative to the measurement frequency range, and the fixture is not so lossy that high absolute accuracy measurements are possible. The method uses a phase correlation approach to model the structure of the fixture to more accurately extract loss, coupling and mismatch behavior than other techniques under similar circumstances.

Embodiments of methods can be included as instructions in a non-transitory, computer readable storage medium as part of a software package for a measuring instrument such as a VNA. Embodiments in accordance with the invention comprise an improved method for measuring quasi-linear quantities on a modulated basis for radios with integrated antennae. This includes the use of highly linear wideband receivers, a relatively wideband digitizing intermediate frequency (IF), and calibration processes to remove mismatch and frequency response effects both over modulation bandwidth and over carrier frequency range.

FIG. 1 illustrates basic structure of a network extraction type in accordance with an embodiment. As illustrated, a device under test (DUT) 100 is connected with a measuring instrument, such as a 2-port VNA, by a fixture 102a, 102b comprising two halves. The measuring instrument is connected with the fixture, for example via coaxial cable, at an outer plane 110a, 110b. The fixture is connected with the DUT at an inner plane 112a, 112b. The fixture has some known or measurable length.

At the outer planes, the measuring instrument can be calibrated using a typical calibration standard, whether using a coaxial calibration or waveguide calibration standard, for example. A user would prefer to further calibrate the system at the inner planes as well, but calibration at the inner planes is not necessarily practical because the geometry is nonstandard. For example, the connections may be mechanically complex and impractical, such as in the case of a probe connected with integrated circuit leads, for example. There is considerable choice in the standards used at the inner plane but the combinations all share the fact that the set is not 'complete' in the sense of a full calibration at that plane. Some fixed error is accepted in exchange for simpler standards and more immunity to repeatability issues.

Techniques for network extraction attempt to characterize those portions of a setup between the outer and inner planes in order to enable a measuring instrument to then characterize the DUT. In accordance with an embodiment, systems and methods attempt to enable fixtures to be characterized with a limited number of standards 120, for example a single reflect standard, such as a short. In one embodiment, a through standard connecting two fixture halves is used.

In accordance with an embodiment, network extraction starts with a line between fixture halves and will assume symmetry of the fixture halves. This line can have any length but that length is specified and errors in the specification will map through to the phase lengths of the extracted fixtures. In other embodiments, asymmetry can be built into the network extraction if a known difference in lengths and characteristics of the fixture halves is known.

In accordance with an embodiment, measured frequency domain data is correlated with a phase function describing the phase scale of interest (defined by the electrical length of the fixture which can be found from user input or a technique such as automatic-reference-plane extension which linearizes the phase function with a known standard in place, whether that be reflection or transmission). Different correlation functions are used for different fixture parameters since the length scales of relevance for those parts of the model are different.

In accordance with an embodiment, a method for network extraction can vary slightly depending on the number of ports involved and the type of standard.

For a 2-port transmission standard, an embodiment can comprise:
1. Extrapolating frequency domain data (4 S-parameters) if needed to remove correlation overrun.
2. Creating a filter function based on the range of phases of interest. The created filter is a wide filter with a narrow phase range for transmission variables and a narrower filter with wide phase range for match variables. Filter selection comprises a modeling process where the parameters are assigned to parts of the measured response that have the expected phase behavior. The filter is rotated in phase by the length scale of interest (full fixture for transmission, near half-fixture for match).
3. Correlating this against the measured frequency domain data and removing excess phase rotation.
4. For transmission, the result includes the product of two fixture halves so a square root process is needed with proper observation of root sign based on the fixture length estimate.
5. The inner plane match is solved for based on the known composite measurement and the previously identified components.

The first step comprising extrapolating frequency domain data makes the measured data more mathematically compatible with localizing according to phase. Typically, a fixed measurement bandwidth extends from a relatively low frequency to 40 GHz or more, for example. When the measurement data are correlated against the phase kernel, the process of correlating can corrupt the last few data points on either end of a measurement bandwidth. By extrapolating the initial frequency data beyond the upper limit of the bandwidth (e.g., beyond 40 GHz), for example by performing a linear fit or some other fitting process, unusable data is pushed out and does not cause problems with the analysis.

The second step of creating a filter function comprises generating a correlator function. The correlator function is generated based on the known time range of the transmission and the length of the fixture. Based on this information, the range of times of interest are identified and a filter width can be determined. For example, if the S21 S-parameter at that transmission is of interest, the amount of phase that elapses when a signal propagates through a fixture can be know with high accuracy, and a narrow phase range is appropriate. For an S11 S-parameter measurement, it may be desirable to encompass reflections from the whole first 90% of the fixture half, so a fairly wide range of phases would be appropriate for capture.

The third step comprises the correlation process. A sequence of steps are taken to isolate different parts of the fixture half. For example, it can be desirable to isolate those parts of a fixture that are contributing to transmission and those parts of a fixture that are contributing to reflection, while not double counting anything.

Applying a method in accordance with an embodiment using a through standard (transmission standard) does not force symmetry on length. However, if the length of each fixture half is known, it can be accounted for in the analysis.

For a 2-port reflect standard, both reflection and transmission variables are found from reflection measurement but the principle is the same. The main difference from the previously described embodiment is that the filters need to get wider to account for distortions near the reflect standard interface.

For a 4-(and higher, treated as multiple differential pairs) port transmission standard, the input includes 16 S-parameters and additional coupling terms in the fixture must be solved for. This is due, for example, to possible crosstalk within the fixture. The general principle is the same, but the filter and correlation process is performed additional times with different phase lengths. A characteristic time or phase change is associated with the cross talk that can be isolated and generate that part of the network parameter. To account for highly coupled structures, the square root process is a matrix-square root process because insertion loss and coupling are intertwined.

For a 4-(and higher, treated as multiple differential pairs) port reflection standard, an embodiment comprising a hybrid method of the previous two embodiments is applied. There are 8 S-parameters of interest (coupling between halves neglected) and filter widths need to increase to take into account distortions near the reflect standard interface.

Once all of the individual parameters have been solved for, the results are assembled into a S-parameter matrix for each fixture portion.

Figure 2:
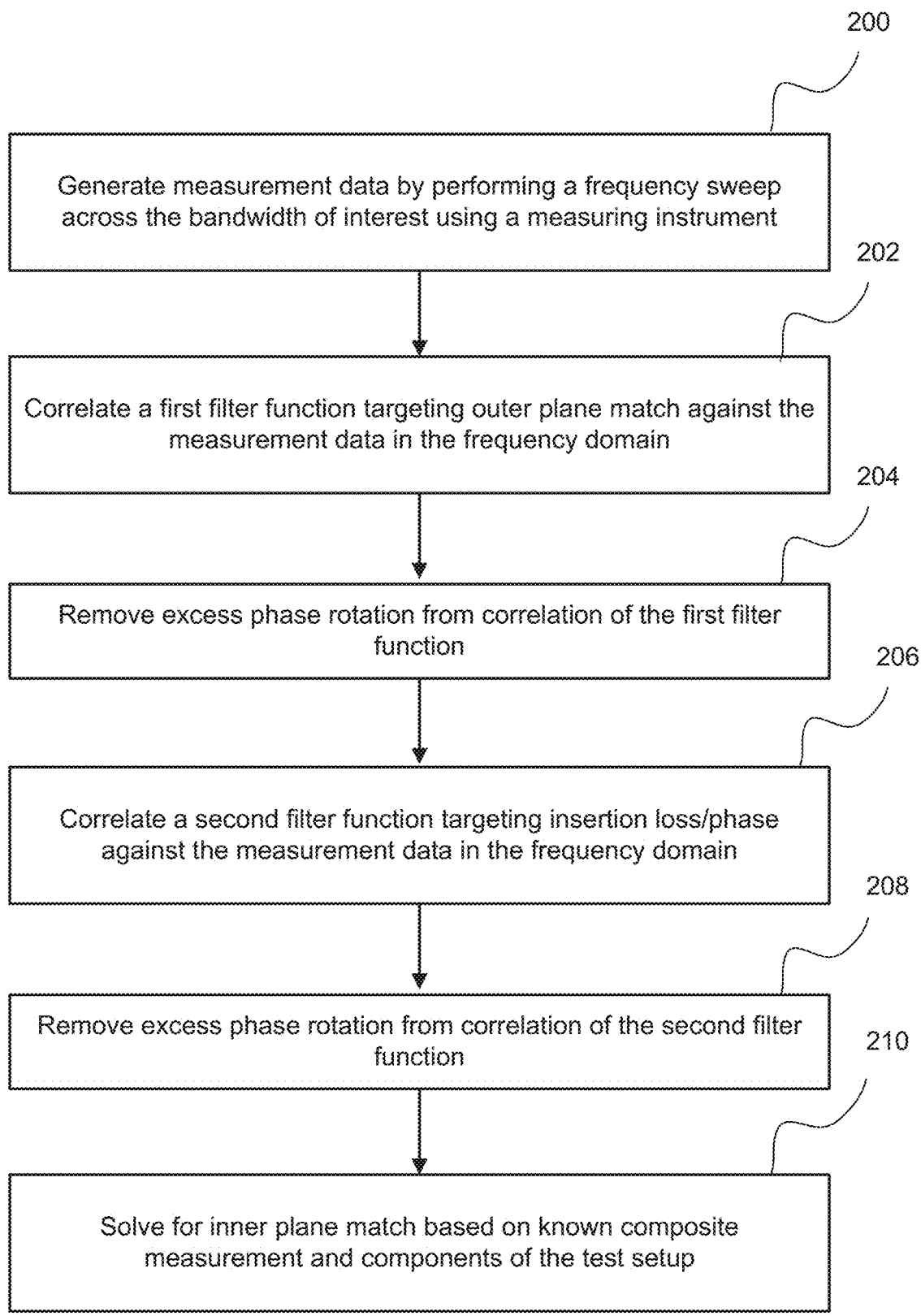
FIG. 2 is a flowchart of a method of network extraction based on phase localization for a 2-port transmission standard, in accordance with an embodiment.

FIG. 2 is a flowchart of a method of network extraction based on phase localization for a 2-port transmission standard, in accordance with an embodiment. The method comprises connecting a measuring instrument to a DUT via a test setup including a fixture having two fixture haves and generating measurement data by performing a frequency sweep across a bandwidth of interest using a measuring instrument (e.g., a VNA) (Step 200). In an embodiment, the measurement data is extrapolated at the ends of the bandwidth to remove correlation overrun. This can include, for example, performing a linear fit.

A first filter function is created and/or selected to target outer plane match. The first filter function is then correlated against the measurement data (including extrapolated data) in the frequency domain (Step 202). Excess phase rotation is then removed (Step 204). A second filter function is created and/or selected to target insertion loss/phase. The second filter function is then correlated against the measurement data in the frequency domain (206). Excess phase rotation is then removed (Step 208). Inner plane match is solved for based on the known composite measurement and previously identified components of the test setup including fixture halves (Step 210). For transmission, a square root process is applied with observation of root sign based on a fixture length estimate to account for a result comprising a product of two fixture halves.

The method of FIG. 2 is provided as an example, while other and/or alternative steps are required for network extraction with a test setup comprising a 2-port reflect standard, a 4-port transmission standard, a 4-port reflect standard, etc.

Differences from Other Extraction Techniques

As mentioned, among the differences with other techniques (specifically time-gating-based techniques) is computational efficiency. In a time gating approach, typically three basic (chirp-Z or similar) transforms are needed to get the original measured data to the time domain, to create the gate, and to bring the final result back to the frequency domain. Additionally, because the transforms are usually not conservative, additional calibration steps are needed that often involve additional transforms.

Embodiments in accordance with the present invention require just one correlation call. Both approaches require additional computation time to create gates/filters and to perform normalizations but there does not appear to be a significant time difference on those steps.

As an example, consider a measurement based on 600 frequency points and Matlab processing of the results:

Time domain gating (three chirp-Z transforms plus calibration signal processing): 11.4 ms.

Phase localized method (embodiment as described herein, 1 correlation): 2.7 ms.

Because frequency sweeps can conceivably be based on many tens of thousands of frequency points, and the computation time for both methods scales super-linearly with point count, the differences can become very large.

Another difference is in how spatially disperse defects in a fixture are handled. It is not uncommon for a time domain approach to treat all mismatch centers as near-point defects, and indeed this is a common physical occurrence. It is, however, not unusual for there to be changes in overall line impedance in a fixture (intentionally or not) that can cover many wavelengths. Treating that as point-defects will only be accurate in the limit of many modeled defects.

As an example, consider a fixture with an intentional impedance change (~1 cm long) in each half. The time domain method in this case tries to model the change as a single reflection center so that the recovered return loss of the fixture half is in error by several dB as illustrated in the plot of FIG. 3.

Figure 3:
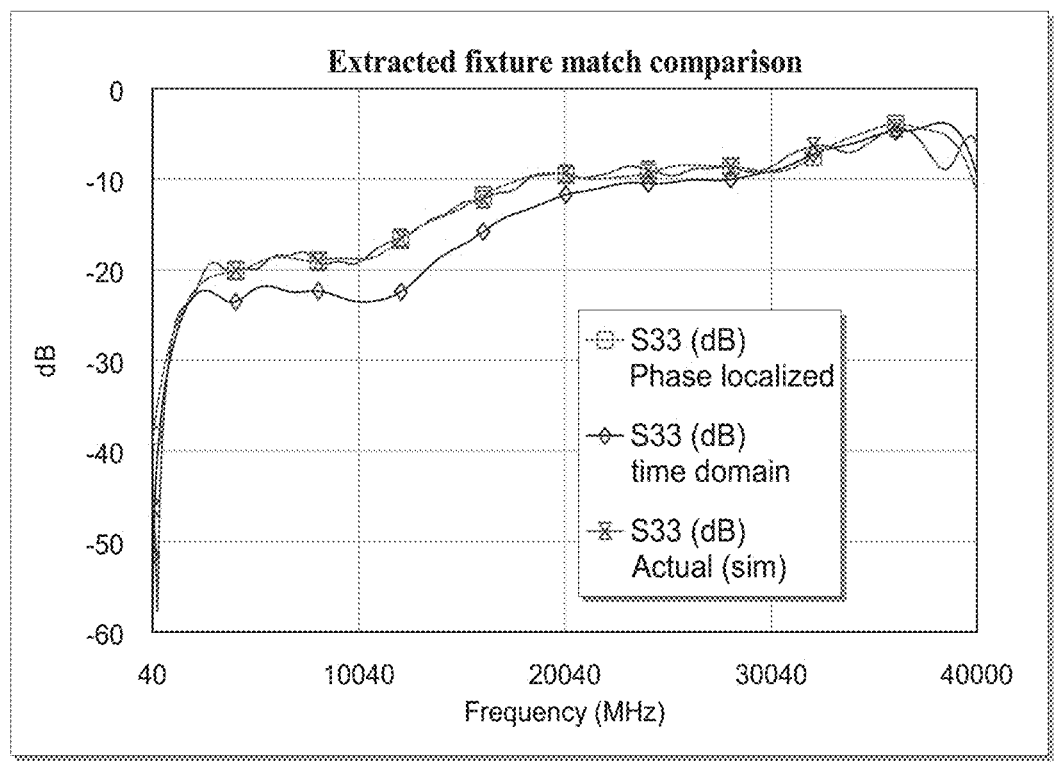
FIG. 3 is a plot illustrating an extracted fixture match comparison.

The error difference illustrated in FIG. 3 also carries over to the case when two point defects are close (relative to resolution) or when a point defect is physically close to a reflection standard. In the latter case, both methods will eventually fail to distinguish the defect but the closeness of approach for a given measurement bandwidth can be different by 2-4× depending on processing choices within the time domain class.

In a method in accordance with another embodiment, which can be thought of as "Phase Localized", a single standard (either a line or a reflect/reflect pair) is used along with an assumption that the fixture is electrically long enough (based on the frequency range being used) and the bulk of the fixture mismatch is not too close to the inner plane. If the assumptions are met, this method can outperform previously discussed embodiments. The method relies on the fixture length being transmission line-like. Functions are cross-correlated with the measured data to better isolate insertion loss and reflection coefficients of the fixture halves.

If the fixture length entry is set to zero, an automatic process (much like auto reference plane delay) will estimate the length.

As with previously described embodiments, entries for the line length or reflect offset length are required and any errors in those values will translate to extracted parameter phase. If the line is chosen as the standard, symmetry between the fixture halves in terms of insertion loss will be assumed. If the reflect standard is chosen, no symmetry is assumed and only one half of the fixture can be extracted if desired. If both halves are to be extracted, length estimates for the individual arms can be entered.

The direct sensitivity to standards definition defects are fairly straightforward since the reflection or transmission coefficient entered is applied multiplicatively to the data prior to a square-root operation. More subtle are non-idealities in the standard, such as mismatch of the line/thru standard. This will have impact through its influence on actual insertion loss during the measurement (in terms of an offset loss and in terms of ripple).

Additional subtleties include the effects of an incorrect fixture length entry. While in previous embodiments, this is mainly used for root choice, it is used in a phase-localized method to determine which phase signatures to correlate against. Entering a significantly incorrect value (10 s of mm generally) can cause added ripple and, eventually, drop outs in insertion loss extractions as well as incorrect return loss values. The internal length estimate approach (entering 0 in the fixture length estimate field triggers this) can reduce the issues and is recommended unless the fixture phase response is very resonant, in which case a proper manual estimate will yield better results.

The issue of where the mismatch is predominantly located was previously described and has somewhat more of an effect when using the reflect standard than using the thru/line standard, since the fixture mismatch and the reflect standard are almost co-located so phase localization becomes difficult. As an example, consider the extraction of a microstrip section using a flush open reflect standard native and when the mismatch near that standard has been distorted from the original, roughly −15 dB to ~−5 dB at high frequencies. The effects on fixture |S21| are added ripple and some substantial differences above 30 GHz (where the mismatch change was the largest).

A full 2-port calibration must be active and the extraction will be run over the current frequency range (which is a subset usually of the calibration frequency range). For four-port systems, at least a full 2-port calibration must be active. There is a requirement that the frequency list have nearly uniform frequency steps (an individual step size cannot deviate from the mean by more than 5%) so some segmented sweep setups (and all log sweep and CW setups) will not be accepted.

The line and reflect offset lengths are entered in millimeters although a calculator is available if values are in picoseconds. If the material type is setup (from the current calibration or manually thereafter), that and any active dispersion relations will be used in the calculations.

The extracted results are stored as .s2p files with port 1 of each file being the outer plane. Details of the file format options (frequency units, etc.) are set by the entries on the sNp setup menu.

In some embodiments, the present invention includes a computer program product which is a storage medium or computer readable medium (media) having instructions stored thereon/in which can be used to program a computer to perform any of the processes of the present invention. The storage medium can include, but is not limited to, any type of disk including floppy disks, optical discs, DVD, CD-ROMs, microdrive, and magneto-optical disks, ROMs, RAMS, EPROMs, EEPROMs, DRAMs, VRAMs, flash memory devices, magnetic or optical cards, nanosystems (including molecular memory ICs), or any type of media or device suitable for storing instructions and/or data.

The previous description of the preferred embodiments is provided to enable any person skilled in the art to make or use the embodiments of the present invention. While the invention has been particularly shown and described with reference to preferred embodiments thereof, it will be understood by those skilled in the art that various changes in form and details may be made therein without departing from the spirit and scope of the invention.

The invention claimed is:

1. A method of network extraction based on phase localization using a test setup including a vector network analyzer (VNA), a fixture having two fixture halves, and a standard, the method comprising:
   connecting two ports of the VNA to the fixture defining an outer plane of the fixture, one port connected to each of the two fixture halves;
   connecting the standard between the two fixture halves defining an inner plane of the fixture;
   using the VNA to perform a radio frequency sweep by applying a radio frequency signal across a radio frequency range of 1 Ghz to 40 Ghz via the two ports through the fixture and the standard;
   measuring frequency domain data from the fixture and the standard in response to the radio frequency sweep using the VNA;
   creating a filter function based on a fixture modeling process;
   applying a phase rotation to the filter function;
   correlating the filter function against the measured frequency domain data to localize phase across the test setup; and
   solving for inner plane match of the test setup based on the measured frequency domain data after removing excess phase rotation from the measured frequency domain data relative to the phase rotation applied to the filter function.

2. The method of claim 1, further comprising:
   selecting a second filter function;
   applying a second phase rotation to the second filter function;
   correlating the second filter function against the measured frequency domain data to localize phase across the test setup;
   solving for outer plane match of the test setup based on the measured frequency domain data after removing excess phase rotation from the measured frequency domain data relative to the phase rotation applied to the second filter function.

3. The method of claim 2, further comprising:
   extrapolating frequency domain data for four scattering (S-) parameters to remove correlation overrun.

4. The method of claim 1, wherein creating the filter function based on a fixture modeling process comprises;
   creating the filter function based on a phase range determined by an electrical length of the fixture.

5. The method of claim 1, wherein creating the filter function based on a fixture modeling process further comprises:

generating a correlator filter function based on a time range for propagation of the radio frequency signal through the fixture.

6. The method of claim 1, further comprising:
applying a square root process with observation of root sign based on a fixture length estimate to account for a result comprising a product of two fixture halves for analysis of transmission variables.

7. The method of claim 1, wherein applying a phase rotation to the filter function comprises:
applying a phase rotation to the filter function based on an electrical length of the fixture for analysis of transmission variables of the fixture.

8. The method of claim 1, wherein creating the filter function based on a fixture modeling process further comprises:
assigning parameters to components of the measured frequency domain data which have an expected phase behavior.

9. The method of claim 1, wherein applying a phase rotation to the filter function comprises:
applying a phase rotation to the filter function based on an electrical length of one fixture half for analysis of match variables of the fixture.

10. The method of claim 1, further comprising:
disconnecting the standard from the fixture;
connecting a device under test (DUT) between the two fixture halves;
characterizing the DUT using the VNA utilizing the inner plane match of the test setup.

11. A method for characterizing a fixture having two fixture halves in a test setup, the method comprising:
connecting two ports of a vector network analyzer (VNA) to the fixture defining an outer plane of the fixture, one port connected to each of the two fixture halves;
connecting a standard between the two fixture halves defining an inner plane of the fixture;
using the VNA to perform a radio frequency sweep by applying a radio frequency signal across a radio frequency range of 1 Ghz to 40 Ghz via the two ports through the fixture and the standard;
using the VNA to measuring frequency domain data from the fixture and the standard in response to the radio frequency sweep;
creating a filter function based on a fixture modeling process;
applying a phase rotation to the filter function;
correlating the filter function against the measured frequency domain data to localize phase across the test setup; and
solving for inner plane match of the test setup based on the measured frequency domain data after removing excess phase rotation from the measured frequency domain data relative to the phase rotation applied to the filter function.

12. The method of claim 11, further comprising:
disconnecting the standard from the fixture;
connecting a device under test (DUT) between the two fixture halves;
characterizing the DUT using the VNA utilizing the inner plane match of the test setup.

13. The method of claim 12, further comprising:
selecting a second filter function;
applying a second phase rotation to the second filter function;
correlating the second filter function against the measured frequency domain data to localize phase across the test setup;
solving for outer plane match of the test setup based on the measured frequency domain data after removing excess phase rotation from the measured frequency domain data relative to the phase rotation applied to the second filter function.

14. The method of claim 12, further comprising:
extrapolating frequency domain data for four scattering (S-) parameters to remove correlation overrun.

15. The method of claim 12, wherein creating the filter function based on a fixture modeling process comprises:
creating the filter function based on a phase range determined by an electrical length of the fixture.

16. The method of claim 12, wherein creating the filter function based on a fixture modeling process further comprises:
generating a correlator filter function based on a time range for propagation of the radio frequency signal through the fixture.

17. The method of claim 12, further comprising:
applying a square root process with observation of root sign based on a fixture length estimate to account for a result comprising a product of two fixture halves for analysis of transmission variables.

18. The method of claim 12, wherein applying a phase rotation to the filter function comprises:
applying a phase rotation to the filter function based on an electrical length of the fixture for analysis of transmission variables of the fixture.

19. The method of claim 12, wherein creating the filter function based on a fixture modeling process further comprises:
assigning parameters to components of the measured frequency domain data which have an expected phase behavior.

20. A system for characterizing a fixture having two fixture halves in a test setup, the system comprising:
a vector network analyzer (VNA) having two ports connected to the fixture defining an outer plane of the fixture, one port connected to each of the two fixture halves;
a standard connected between the two fixture halves defining an inner plane of the fixture;
wherein the VNA is configured to perform steps comprising,
performing a radio frequency sweep by applying a radio frequency signal across a radio frequency range of 1 Ghz to 40 Ghz via the two ports through the fixture and the standard;
measuring frequency domain data from the fixture and the standard in response to the radio frequency sweep;
creating a filter function based on a fixture modeling process;
applying a phase rotation to the filter function;
correlating the filter function against the measured frequency domain data to localize phase across the test setup; and
solving for inner plane match of the test setup based on the measured frequency domain data after removing excess phase rotation from the measured frequency domain data relative to the phase rotation applied to the filter function.

* * * * *